(12) United States Patent
Jung et al.

(10) Patent No.: US 6,531,562 B2
(45) Date of Patent: Mar. 11, 2003

(54) PHOTORESIST MONOMER, POLYMER THEREOF AND PHOTORESIST COMPOSITION CONTAINING IT

(75) Inventors: Min Ho Jung, Ichon-shi (KR); Jae Chang Jung, Ichon-shi (KR); Geun Su Lee, Ichon-shi (KR); Ki Ho Baik, Ichon-shi (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 10/146,277

(22) Filed: May 14, 2002

(65) Prior Publication Data

US 2002/0151666 A1 Oct. 17, 2002

Related U.S. Application Data

(62) Division of application No. 09/621,068, filed on Jul. 21, 2000, now Pat. No. 6,448,352.

(30) Foreign Application Priority Data

Jul. 30, 1999 (KR) .............................................. 99-31305

(51) Int. Cl.$^7$ .............................................. C08F 218/00
(52) U.S. Cl. .................... 526/307.7; 526/258; 526/259; 526/264; 526/265; 526/271; 526/281; 526/305; 526/307.1; 526/318; 526/318.2; 526/318.3; 526/320; 526/321; 526/323.2
(58) Field of Search .................... 526/258, 259, 526/264–265, 271, 281, 318, 318.2, 318.3, 320, 321, 323.2, 305, 307.1, 307.7; 430/270.1; 560/116, 118

(56) References Cited

PUBLICATIONS

Masataka Ihara et al., *Tetrahedron*, 1992, 48, 5089–5098.

Masataka Ihara et al., *J. Am. Chem. Soc.*, 1988, 110, 1963–1964.

Masataka Ihara et al., *J. Am. Chem. Soc.*, 1990, 112, 1164–1171.

*Primary Examiner*—Helen L. Pezzuto
(74) *Attorney, Agent, or Firm*—Townsend and Townsend and Crew LLP

(57) ABSTRACT

The present invention provides novel bicyclic photoresist monomers, and photoresist copolymer derived from the same. The bicyclic photoresist monomers of the present invention comprise both amine functional group and acid labile protecting group, and are represented by the formula:

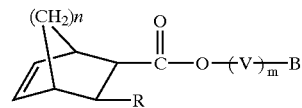

where m, n, R, V and B are those defined herein. The photoresist composition comprising the photoresist copolymer of the present invention has excellent etching resistance and heat resistance, and remarkably enhanced PED stability (post exposure delay stability).

7 Claims, No Drawings

PHOTORESIST MONOMER, POLYMER THEREOF AND PHOTORESIST COMPOSITION CONTAINING IT

This application is a divisional of Ser. No. 09/621,068, filed on Jul. 21, 2000, now U.S. Pat. No. 6,448,352.

BACKGROUND OF THE INVENTION

1. Field of the Invention

The present invention relates to novel photoresist monomers, polymers formed therefrom, and photoresist compositions containing the same. In particular, the present invention is directed to a bicyclic photoresist monomer compound comprising both amine and protecting group. Moreover, the present invention is also directed to polymers, and a photoresist compositions derived from the bicyclic photoresist monomers, and uses thereof, such as in photolithography processes using a DUV (deep ultraviolet) light source for preparing highly integrated semiconductor devices.

2. Description of the Background Art

Recently, chemical amplification type DUV photoresists have been investigated for achieving a high sensitivity in minute image formation processes for preparing semiconductor devices. Such photoresists are typically prepared by blending a photoacid generator and a matrix resin polymer having an acid labile group. The resolution of a lithography process depends, among others, on the wavelength of the light source, i.e., shorter the wavelength, smaller the pattern formation.

In general, a useful photoresist (hereinafter, abbreviated to as "PR") has a variety of desired characteristics, such as an excellent etching resistance, heat resistance and adhesiveness. Moreover, the photoresist should be easily developable in a readily available developing solution, such as 2.38% aqueous tetramethylammonium hydroxide (TMAH) solution. However, it is very difficult to synthesize a photoresist polymer, especially DUV photoresist, which meets all of these desired characteristics. For example, a polymer having a polyacrylate polymer backbone are readily available, but it has a poor etching resistance and is difficult to develop. In order to increase its etching resistance, several groups have added an alicyclic unit to the polymer backbone. However, photoresist copolymers comprising entirely of an alicyclic polymer backbone is difficult to form.

To solve some of the problems described above, Bell Research Center developed a polymer having the following chemical formula:

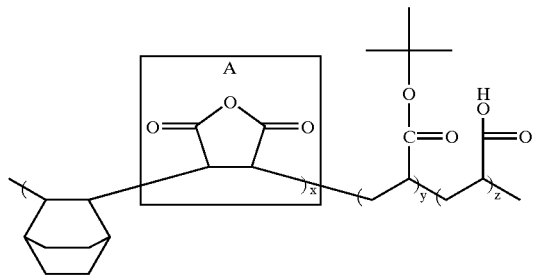

where the polymer backbone is substituted with a norbornene, an acrylate and a maleic anhydride unit. Unfortunately, even in the unexposed regions, the maleic anhydride moiety ('A' portion) dissolves readily in 2.38 wt % aqueous TMAH solution. Therefore, in order to inhibit the dissolution of the polymer in the unexposed section, the ratio of 'Y' portion having tert-butyl substituent must be increased, but this increase results in a relative decrease in the 'Z' portion, which is responsible for the adhesiveness of the photoresist polymer. This decrease in the relative amount of the 'Z' portion may result in separation of the photoresist from the substrate during a pattern formation. In order to circumvent the dissolution problem of maleic anhydride, cholesterol type dissolution inhibitors have been added to the photoresist polymers to form a two-component system. However, the increased amount of the dissolution inhibitor [about 30%(w/w) of the resin] resulted in, among others, poor reappearance, high production cost, poor adhesiveness, and a severe top-loss of the resist in the etching process resulting in a poor pattern formation.

Despite these difficulties, a variety of photoresist polymers with improved etching resistance, adhesiveness and resolution have been developed. Unfortunately, however, most chemically-amplified photoresists currently available have a relatively short post exposure delay (PED) stability. In general, when there is delay between exposure of the photoresist to light and development of the exposed photoresist, acids that are generated on the exposed area are neutralized by amine compounds which may be present in the production atmosphere. Since the pattern formation depends on acids that are generated by the exposure, neutralization of acids by atmospheric amine compounds reduce, prevent or alter a pattern formation, e.g., a T-topping phenomenon may occur where the top portion of the pattern forms a T-shape.

Therefore, there is a need for a photoresist polymer having an excellent etching properties, heat resistance and enhanced PED stability.

SUMMARY OF THE INVENTION

An object of the present invention is to provide a novel PR polymer having an excellent etching and heat resistance, and an enhanced PED stability. The present inventors have found that a polymer derived from a monomer comprising a bicyclo compound has an excellent etching and heat resistance, and an enhanced PED stability.

Another object of the present invention is to provide PR polymers using the PR monomers described above and a process for preparing the same.

Another object of the present invention is to provide photoresist compositions using the PR polymers described above, and a process for preparing the same.

Still another object of the present invention is to provide a semiconductor device produced by using the PR composition.

DETAILED DESCRIPTION OF THE INVENTION

The present invention provides a bicyclic PR monomers comprising an amine functional group and an acid labile protecting group. In particular, bicyclic PR monomers of the present invention are compounds of the formula:

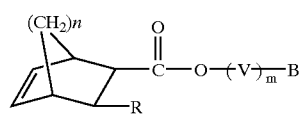

1 where B is selected from the group consisting of moieties of the formula:

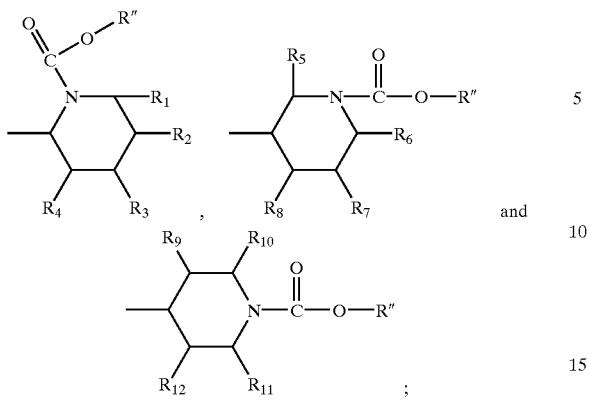

R is hydrogen, substituted or non-substituted ($C_1$–$C_{10}$) straight or branched chain alkyl, cycloalkyl, alkoxyalkyl, cycloalkoxyalkyl, —COOR', —$(CH_2)_t$ OH, —COO$(CH_2)_t$OH or a moiety of the formula:

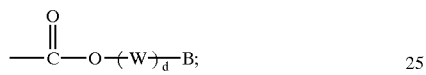

each of V and W is independently substituted or non-substituted ($C_1$–$C_{10}$) straight or branched chain alkyl, cycloalkyl, alkoxyalkyl or cycloalkoxyalkyl;
R' is hydrogen, substituted or non-substituted ($C_1$–$C_{10}$) straight or branched chain alkyl, cycloalkyl, alkoxyalkyl or cycloalkoxyalkyl; R" is an acid labile protecting group;
each of $R_1$–$R_{12}$ is independently hydrogen, substituted or non-substituted —($C_1$—$C_{10}$) straight or branched chain alkyl, cycloalkyl, alkoxyalkyl, cycloalkoxyalkyl, $CH_2OH$ or —$CH_2CH_2OH$;
n is an integer from 1 to 3; and
each of d, m and t is independently an integer from 0 to 5.

The acid labile protecting group is preferably selected from the group consisting of tert-butyl, tetrahydropyran-2-yl, 2-methyl tetrahydropyran-2-yl, tetrahydrofuran-2-yl, 2-methyl tetrahydrofaran-2-yl, 1-methoxypropyl, 1-methoxy-1-methylethyl, 1-ethoxypropyl, 1-ethoxy-1-methylethyl, 1-methoxyethyl, 1-ethoxyethyl, tert-butoxyethyl, 1-isobutoxyethyl and 2-acetylmenth-1-en-1-yl.

Particularly preferred bicyclo PR monomers of the present invention are:

2-(1-tert-butoxycarbonylpiperidin-2-yl)ethyl 5-norbornene-2-carboxylate:

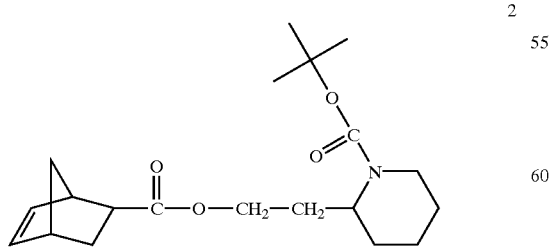

2-(1-tert-butoxycarbonylpiperidin-2-yl)ethyl 5-norbornene-2,3-dicarboxylate:

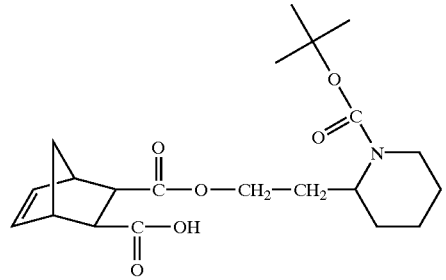

2-(1-tert-butoxycarbonylpiperidin-2-yl)ethyl, 3-tert-butyl 5-norbornene-2,3-dicarboxylate:

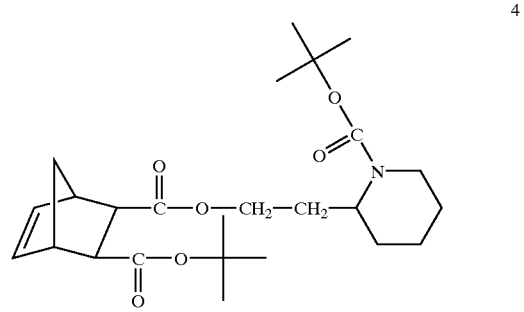

2,3-di[(1-tert-butoxycarbonylpiperidin-2-yl)ethyl]5-norbornene-2,3-dicarboxylate;

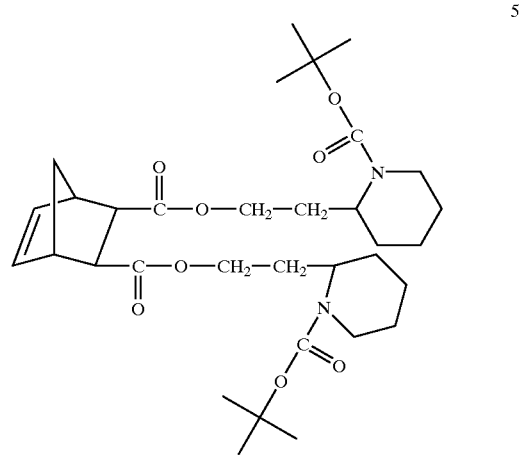

The compound represented by Chemical Formula 1 can be prepared by a variety of methods. In one method of preparing compounds of formula 1, which is particularly useful for compounds 1 where R is hydrogen or substituted or non-substituted ($C_1$–$C_{10}$) straight or branched chain alkyl, cycloalkyl, alkoxyalkyl or cycloalkoxyalkyl, the method comprises:

(a1) reacting a diene compound of the formula:

6

5 with an acrylate of the formula:

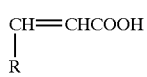

7 to produce a bicyclic carboxylic acid of the formula:

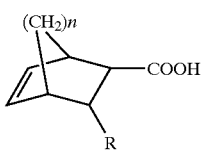

8 where R is hydrogen or substituted or non-substituted ($C_1$–$C_{10}$) straight or branched chain alkyl, cycloalkyl, alkoxyalkyl or cycloalkoxyalkyl; and n is an integer from 1 to 3;

(b1) reacting the bicyclic carboxylic acid 8 with thionyl chloride ($SOCl_2$), preferably in an equal molar amount; and (c1) reacting the product of step (b1) with a hydroxy compound of the formula:

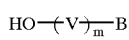

9 to produce the desired compound 1, where B, V and m are those defined above.

In particular, compound 6 is dissolved in an organic solvent and cooled to temperature in the range of from about −35° C. to about −25° C., and compound 7 is slowly added to the mixture. The resulting reaction mixture is stirred for about 8 to 12 hours at temperature in the range of from about −35° C. to about −25° C. After which the reaction temperature is allowed to reach room temperature. The resulting mixture is stirred for additional about 8 to 12 hours. Compound 8 can be recovered by a standard work-up followed by concentration of the resulting organic phase.

In the step (c1) above, triethylamine, preferably in an equal molar amount, is added to the reaction mixture to neutralize any acids that is formed in the reaction mixture. An aqueous work-up followed by drying the organic phase, filtering, and removing the organic solvent, e.g., by vacuum distillation, provides the desired compound.

In another method of preparing compounds of formula 1, which is particularly useful for compounds 1 where R is COOR' or a moiety of the formula

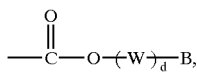

the method comprises:

(a2) reacting a diene compound of formula 6 with maleic anhydride to produce 5-norbornene-2,3-dicarboxylic anhydride;

(b2) (i) when R is COOR', contacting said 5-norbornene-2,3-d (dicarboxylic anhydride with R'OH in the presence of an acid catalyst to produce a 5-norbornene-2,3-dicarboxylate compound; or (ii) when R is

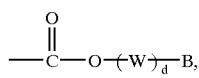

hydrating said 5-norbornene-2,3-dicarboxylic anhydride to produce a 5-norbomrene-2,3-dicarboxylic acid; and (c2) reacting the 5-norbornene-2,3-dicarboxylate compound or 5-norbornene-2,3-dicarboxylic acid with a hydroxy compound of formula 9 to produce the desired compound 1, where B, W, R' and d are those defined above.

More specifically, in the step (a2) above, compound 6 is dissolved in an organic solvent and cooled at temperature in the range of from about −35° C. to about −25° C. Maleic anhydride, preferably in a solution and in an equal amount, is slowly added to the resulting solution. The reaction mixture is then stirred for about 8 to 12 hours at temperature in the range of from about −35° C. to about −25° C. After which the reaction temperature is allowed to reach room temperature. The reaction mixture is stirred for additional about 8 to 12 hours, and the 5-norbornene-2,3-dicarboxylic anhydride is obtained after removing the organic solvent.

And, when the R is

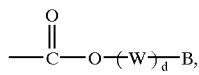

the step of (c2) comprises reacting the hydroxy compound 9, preferably in an amount which is double the theoretical amount (in moles) of the 5-norbornene-2,3-dicarboxylate compound, in the presence of triethylamine, preferably in the amount equal to the amount of the hydroxy compound 9. Aqueous work-up followed by drying the organic phase, filtering and concentrating, e.g., by vacuum distillation, then provides the desired compound of formula 1. While any non-protic organic solvent can be used in the steps (a1) or (a2) above, preferred organic solvents include tetrahydrofuran (THF), dimethylformamide, dimethylsulfoxide, dioxane, benzene, toluene and xylene.

The present invention also provides a PR copolymers which is derived from a monomer comprising a compound of formula 1. The PR copolymer according to the present invention can further comprise a second monomer selected from compounds of the formulas:

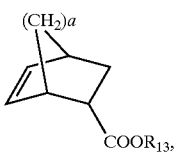

10

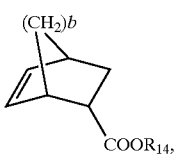

11

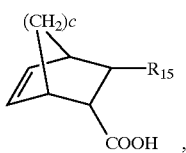

and mixtures therof;

where $R_{13}$ is substituted or non-substituted ($C_1$–$C_{10}$) straight or branched chain alcohol; $R_{14}$ is an acid labile protecting group; $R_{15}$ is hydrogen or —COOH; and a, b, and c are independently an integer from 1 to 3. The copolymer of the present invention can further comprise maleic anhydride as a third monomer.

Preferably, the PR copolymer of the present invention has a molecular weight in the range of from about 3000 to about 100,000. Moreover, the PR copolymer of the present invention comprises the following copolymer:

poly(tert-butyl 5-norbornene-2-carboxylate/2-hydroxyethyl 5-norbornene-2-carboxylate/5-norbornene-2-carboxylic acid/2-(1-tert-butoxycarbonylpiperidin-2-yl)ethyl 5-norbornene-2-carboxylate/maleic anhydride):

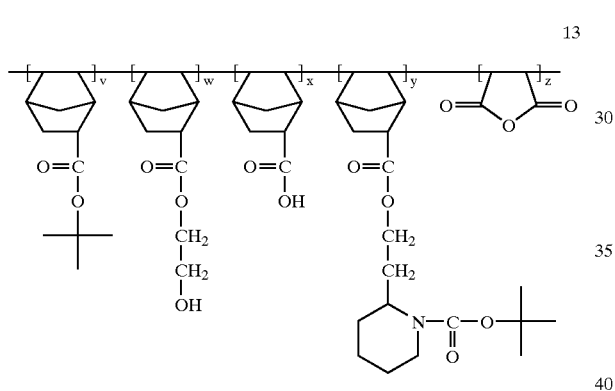

Poly(tert-butyl 5-norbornene-2-carboxylate/2-hydroxyethyl 5-norbornene-2-carboxylate/5-norbornene-2-carboxylic acid/2-(1-tert-butoxycarbonylpiperidin-2-yl)ethyl 5-norbornene-2,3-dicarboxylate/maleic anhydride):

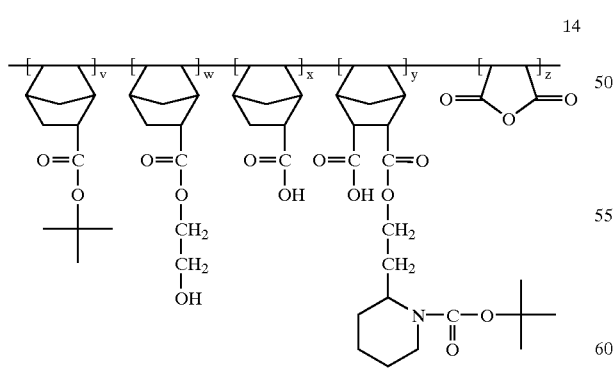

Poly(tert-butyl 5-norbornene-2-carboxylate/2-hydroxyethyl 5-norbornene-2-carboxylate/5-norbornene-2-carboxylic acid/2-(1-tert-butoxycarbonylpiperidin-2-yl)ethyl, 3-tert-butyl 5-norbornene-2,3-dicarboxylate/maleic anhydride):

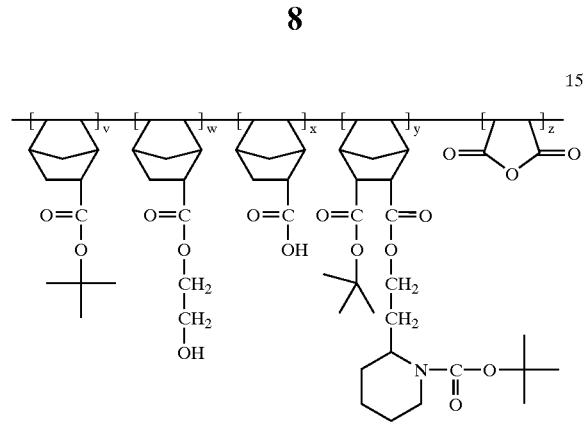

Poly(tert-butyl 5-norbornene-2-carboxylate/2-hydroxyethyl 5-norbornene-2-carboxylate/5-norbornene-2-carboxylic acid/2,3-di[(1-tert-butoxycarbonylpiperidin-2-yl)ethyl]5-norbornene-2,3-dicarboxylate/maleic anhydride):

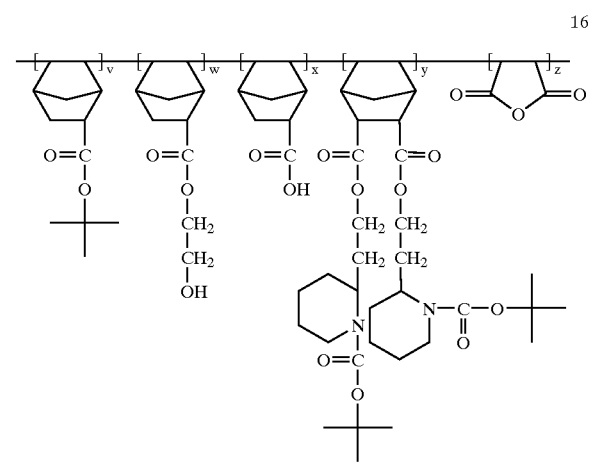

Poly(tert-butyl 5-norbornene-2-carboxylate/2-hydroxyethyl 5-norbornene-2-carboxylate/5-norbornene-2,3-dicarboxylic acid/2,3-di[(1-tert-butoxycarbonylpiperidin-2-yl)ethyl]5-norbornene-2,3-dicarboxylate/maleic anhydride):

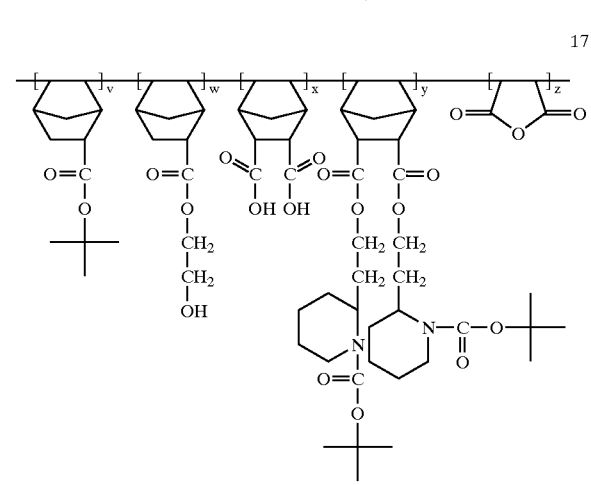

In the above Chemical Formulas 13 to 17, the ratio of v:w:x:y:z is preferably 0.01 to 99 mol %: 0.01 to 99 mol %: 0.01 to 35 mol %: 0.01 to 35 mol %: 0.01 to 99 mol %.

The copolymer of the present invention can be prepared by radical polymerization of monomers with a conventional radical polymerization initiator. An exemplary procedure for preparing copolymers of the present invention includes the steps of:

(a) admixing
  (i) a compound of formula 1,
  (ii) a second monomer selected from the group consisting of compounds of formulas 10, 11, 12, and mixtures thereof,
  optionally (iii) maleic anhydride,
  (iv) a polymerization initiator; in an organic solvent; and
(b) polymerizing the admixture under an inert atmosphere, preferably under nitrogen or argon atmosphere.

The polymerization can be carried out by either a bulk polymerization or a solution polymerization. Exemplary solvents suitable for polymerization include cyclohexanone, tetrahydrofuran, dimethylformamide, dimethylsulfoxide, dioxane, methyl ethyl ketone, benzene, toluene and xylene.

Exemplary polymerization initiators include any conventional radical polymerization initiators such as benzoylperoxide, 2,2'-azobisisobutyronitile (AIBN), acetylperoxide, laurylperoxide, tert-butylperacetate, tert-butylhydroperoxide and di-tert-butylperoxide. Preferred polymerization temperature is in the range of from about 40° C. to about 90° C., and a preferred polymerization reaction time is in the range of from about 4 hours to about 20 hours.

The present invention also provides a PR composition comprising the PR copolymer of the present invention, an organic solvent, and a photoacid generator.

Preferred photoacid generators include sulfides and onium type compounds. In one particular embodiment of the present invention, the photoacid generator is selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate and dibutylnaphthylsulfonium triflate. Typically, the amount of photoacid generator used is from about 0.05% by weight to about 10% by weight of the photoresist resin employed. It has been found that when the photoacid generator is used in the amount less than about 0.05%, it lowers photosensitivity of the PR composition, and when the photoacid generator is used in the amount greater than about 10%, it results in poor patterning due to its large absorption of DUV (Deep Ultra Violet).

Exemplary organic solvents suitable in PR compositions of the present invention include methyl 3-methoxypropionate, ethyl 3-ethoxypriopionate, propylene glycol methyl ether acetate, cyclohexanone, 2-heptanone and (2-methoxy)ethyl acetate. The amount of solvent used is preferably in the range of from about 200% to about 1000% by weight of the PR resin (i.e., copolymer). This ratio has been found to be particularly used in obtaining a photoresist layer of desirable thickness when coated on to a suitable substrate such as a silicon wafer in production of a semiconductor element. In particular, it has been found by the present inventors that when the amount of organic solvent is about 600% by weight of the PR copolymer, a PR layer having 0.5 μm of thickness may be obtained.

The PR composition is prepared by dissolving the copolymer of the present invention in an organic solvent to the amount of about 10% to about 30% by weight of the solvent, adding the photoacid generator in the amount of from about 0.05% to about 10% by weight of the copolymer, and filtering the resulting composition through a hyperfine filter.

The PR composition prepared by the present invention has an excellent etching resistance, adhesiveness and heat resistance. Also, its remarkably enhanced PED stability makes it very useful as ArF photosensitive film.

The present invention provides the method for forming the PR pattern as follows: (a) coating the above described photoresist composition on a substrate of semiconductor element to form a photoresist film; (b) exposing the photoresist film to light using a light source; and (c) developing the photoresist film, for example, using an alkaline solution such as 2.38 wt % TMAH solution. Optionally, the photoresist film can be heated (i.e., baked), preferably to temperature in the range of from about 70° C. to about 200° C., before and/or after the step (b).

Exemplary light sources which are useful for forming the PR pattern include ArF (193 nm), KrF (248 nm), VUV (157 nm), EUV, E-beam, X-ray and ion beam. Preferably, the irradiation energy is in the range of from about 1 mJ/cm² to about 100 mJ/cm².

The present invention also provides a semiconductor device, which is manufactured using the photoresist composition described above.

Additional objects, advantages, and novel features of this invention will become apparent to those skilled in the art upon examination of the following examples thereof, which are not intended to be limiting.

EXAMPLES

Preparation of the Photoresist Monomers

Synthesis of 1-tert-Butoxycarbonyl-2-(2-hydroxyethyl)piperidine

About 1 equiv. of di-tert-butyl dicarbomate was slowly added to a solution of 2-piperidineethanol in an organic solvent, while maintaining the reaction temperature at about 5° C. The reaction mixture was stirred for about 2 hours. After which the reaction temperature was allowed to reach room temperature. The reaction mixture was stirred for additional 10 hours. The organic solvent was removed using a rotary evaporator. And the resulting residue was vacuum distilled to yield a compound having the following chemical formula (yield: 82%):

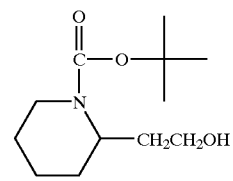

Example 1

Synthesis of 2-(1-tert-Butoxycarbonylpiperidin-2-yl) ethyl 5-norbornene-2-carboxylate Cyclopentadiene, which was obtained by thermolysis of dicyclopentadiene, was dissolved in a conventional organic solvent, and solution was cooled to about −30° C. About 1 equiv. of cooled acryl acid was slowly added to the solution. The reaction mixture was stirred for about 10 hours, after which the reaction mixture was allowed to reach room temperature and stirred for additional 10 hours. The solvent was removed using a rotary evaporator, and 5-norbornene-2-carboxylic acid was obtained by vacuum distillation. About 1 mole of 5-norbornene-2-carboxylic acid and about 1 mole of thionyl chloride were slowly combined and agitated in a bath. The remaining or unreacted thionyl chloride was removed and about 1 mole of triethylamine and (1-tert-butoxycarbonyl-2-piperidine)ethanol were added to the mixture. The organic layer was extracted with ethyl acetate. And the organic layer was separated, dried over anhydrous $MgSO_4$, and concentrated to provide the title compound represented by formula 2 in 75% yield.

Example 2

Synthesis of 2-(1-tert-Butoxycarbonylpiperidin-2-yl) ethyl 5-norbornene-2,3-dicarboxylate Using the procedure of Example 1, cyclopentadiene was reacted with maleic anhydride to provide 5-norbornene-2,3-dicarboxylic anhydride, which was then slowly added to a 10% NaOH aqueous solution. The resulting mixture was heated to about 85° C. for about 90 minutes and slowly cooled to room temperature. The resulting solution was neutralized by adding 10% sulfuric acid drop-wise. The reaction mixture was extracted using ethyl acetate. The organic phase was separated, dried over anhydrous $MgSO_4$, filtered, and concentrated to yield 5-norbornene-2,3-dicarboxylic acid as a white solid.

About 1 mole of 5-norbornene-2,3-dicarboxylic acid and about 1 mole of thionyl chloride were combined and slowly agitated in a bath. After the reaction was complete, the remaining or unreacted thionyl chloride was removed and 1 mole of triethylamine and 1 mole of (1-tert-butoxycarbonyl-2-piperidine)ethanol were added to the reaction mixture. The reaction mixture was quenched and extracted with ethyl acetate. The organic phase was separated, dried over anhydrous $MgSO_4$, filetered, and concentrated to provide the title compound represented by formula 3 in 72% yield.

Example 3

Synthesis of 2-(1-tert-Butoxycarbonylpiperidin-2-yl) ethyl, 3-tert-Butyl 5-norbornene-2,3-dicarboxylate 5-Norbornene-2,3-dicarboxylic anhydride was obtained using the procedure of Example 2. About 1 mole of 5-norbornene-2,3-dicarboxylic anhydride and about 1 mole of tert-butanol were slowly combined and stirred in the presence of an acid catalyst. The resulting mixture was refluxed at about 60° C. for about 5 hours, and slowly cooled to room temperature. The reaction mixture was quenched and extracted with ethyl acetate. The organic phase was separated, dried over anhydrous $MgSO_4$, filtered, and concentrated to provide tert-butyl 5-norbornene-2,3-dicarboxylate as a white solid.

About 1 mole of tert-butyl 5-norbornene-2,3-dicarboxylate and about 1 mole of thionyl chloride were combined and slowly agitated in a bath. After the reaction was completed, the remaining thionyl chloride was removed and 1 mole of triethylamine and 1 mole of the (1-tert-butoxycarbonyl-2-piperidine)ethanol were added to the reaction mixture. The reaction was quenched and extracted with ethyl acetate. The organic phase was separated, dried over anhydrous $MgSO_4$, filtered, and concentrated to provide the compound of formula 4 in 70% yield.

Example 4

Synthesis of 2,3-di[(1-tert-Butoxycarbonylpiperidin-2-yl)ethyl]5-norbornene-2,3-dicarboxylate Using the procedure of Example 2, maleic anhydride and cyclopentadiene were reacted to produce 5-norbornene-2,3-dicarboxylic acid as a white solid. About 1 mole of 5-norbornene-2,3-dicarboxylic acid and about 2 moles of thionyl chloride were slowly agitated in a bath. Upon the completion of the reaction, the remaining thionyl chloride was removed and 2 moles of triethylamine and 2 moles of (1-tert-butoxy carbonyl-2-piperidine)ethanol were added. Work-up followed by concentration as described in Example 2 gave the title compound of formula 5 in 65% yield.

Preparation of the Photoresist Polymers

Example 5

Synthesis of poly(tert-Butyl 5-norbornene-2-carboxylate/2-hydroxyethyl 5-norbornene-2-carboxylate/5-norbornene-2-carboxylic acid/2-(1-tert-butoxycarbonylpiperidin-2-yl)ethyl 5-norbornene-2-carboxylate/maleic anhydride)

0.80 mole of tert-butyl 5-norbornene-2-carboxylate, 0.1 mole of 2-hydroxyethyl 5-norbornene-2-carboxylate, 0.05 mole of 5-norbornene-2-carboxylic acid, 0.05 mole of 2-(1-tert-butoxycarbonylpiperidin-2-yl)ethyl 5-norbornene-2-carboxylate and 1 mole of maleic anhydride were dissolved in a solvent such as THF. Then, 5.5 g of polymerization initiator, AIBN, was added to the resulting solution and the polymerization was carried out under an Argon atmosphere at temperature of about 67° C. for about 10 hours. After which the reaction mixture was precipitated using ethyl ether, and the precipitate was collected and vacuum dried to provide the title copolymer compound of formula 13 in 32% yield.

Example 6

Synthesis of poly(tert-Butyl 5-norbornene-2-carboxylate/2-hydroxyethyl 5-norbornene-2-carboxylate/5-norbornene-2-carboxylic acid/2-(1-tert-butoxycarbonylpiperidin-2-yl)ethyl 5-norbornene-2,3-dicarboxylate/maleic anhydride)

The procedure of Example 5 was repeated except for using 0.05 mole of 2-1-tert-butoxycarbonylpiperidin-2-yl) ethyl 5-norbornene-2,3-dicarboxylate instead of 0.05 mole of 2-(1-tert-butoxycarbonylpiperidin-2-yl)ethyl

Example 7

Synthesis of poly(tert-Butyl 5-norbornene-2-carboxylate/2-hydroxyethyl 5-norbornene-2-carboxylate/5-norbornene-2-carboxylic acid/2-(1-tert-butoxncarbonylpiperidin-2-yl)ethyl, 3-tert-butyl 5-norbornene-2,3-dicarboxylate/maleic anhydride)

The procedure of Example 5 was repeated except for using 0.05 mole of 2-(1-tert-butoxycarbonylpiperidin-2-yl) ethyl, 3-tert-butyl 5-norbornene-2,3-dicarboxylate instead of 0.05 mole of 2-(1-tert-butoxycarbonylpiperidin-2-yl) ethyl 5-norbornene-2-carboxylate to obtain the title compound of formula 15 (yield: 32%).

Example 8

Synthesis of poly(tert-Butyl 5-norbornene-2-carboxylate/2-hydroxyethyl 5-norbornene-2-carboxylate/5-norbornene-2-carboxylic acid/2,3-di[(1-tert-butoxycarbonylpiperidin-2-yl)ethyl]5-norbornene-2,3-dicarboxylate/maleic anhydride)

The procedure of Example 5 was repeated except for using 0.05 mole of 2,3-di[(1-tert-butoxycarbonylpiperidin-2-yl)ethyl]5-norbornene-2,3-dicarboxylate instead of 0.05 mole of 2-(1-tert-butoxycarbonylpiperidin-2-yl)ethyl 5-norbornene-2-carboxylate to obtain the title compound of formula 16 (yield: 31%).

Example 9

Synthesis of poly(tert-Butyl 5-norbornene-2-carboxylate/2-hydroxyethyl 5-norbornene-2-carboxylate/5-norbornene-2.3-dicarboxylic acid/2,3-di[(1-tert-butoxycarbonylpiperidin-2-yl)ethyl]5-norbornene-2.3-dicarboxylate/maleic anhydride)

The procedure of Example 8 was repeated except for using 0.05 mole of 5-norbornene-2,3-dicarboxylic acid instead of 0.05 mole of 5-norbornene-2-carboxylic acid to obtain the title compound of formula 17 (yield: 32%).

Preparation of Photoresist Compositions, and Formation of a Photoresist Pattern by Using the Same

Example 10

The copolymer obtained from Example 5 (10 g) and triphenylsulfonium triflate (0.12 g) as a photoacid generator were dissolved in ethyl 3-ethoxypropionate (60 g), and the resultant mixture was filtered through a 0.10 μm filter to prepare a photoresist solution. The photoresist solution thus prepared was spin-coated on a silicon wafer, and soft-baked at 110° C. for 90 seconds. After baking, the photoresist was exposed to light by using an ArF laser exposer, and then post-baked at 110° C. for 90 seconds. When the post-baking was completed, it was developed in 2.38 wt % aqueous TMAH (tetramethylammonium hydroxide) solution for 40 seconds, to obtain a 0.13 μm L/S pattern on the resist, having the thickness of approximately 0.5 μm.

Example 11

The procedure of Example 10 was repeated except that the copolymer of formula 14, obtained from Example 6, was used instead of the copolymer of formula 13 from Example 5. By using this photoresist composition, 0.13 μm L/S pattern was obtained on the resist having the thickness of approximately 0.5 μm.

Example 12

The procedure of Example 10 was repeated except that the copolymer of formula 15, obtained from Example 7 was used instead of the copolymer of formula 13 from Example 5. By using this photoresist composition, 0.13 μm L/S pattern was obtained on the resist having the thickness of approximately 0.5 μm.

Example 13

The procedure of Example 10 was repeated except that the copolymer of formula 16, obtained from Example 8 was used instead of the copolymer of formula 13 from Example 5. By using this photoresist composition, 0.131 μm L/S pattern was obtained on the resist having the thickness of approximately 0.5 μm.

Example 14

The procedure of Example 10 was repeated except that the copolymer of formula 17, obtained from Example 9 was used instead of the copolymer of formula 13 from Example 5. By using this photoresist composition, 0.13 μm L/S pattern was obtained on the resist having the thickness of approximately 0.5 μm.

As shown above, the present invention provides photoresist compositions with good etching resistance, remarkably enhanced resolution of photoresist, and PED stability.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g., as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A bicyclic photoresist monomer of the formula:

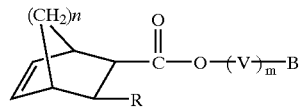

wherein B is selected from the group consisting of moieties of the formula:

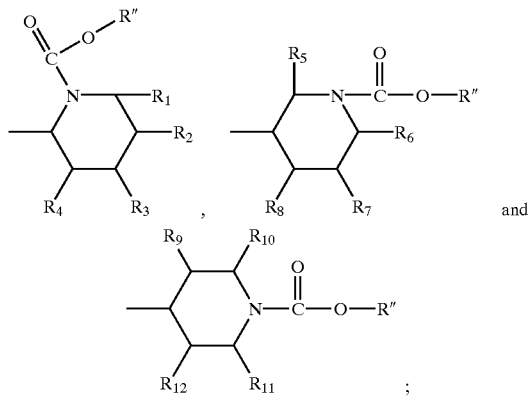

R is hydrogen, substituted or non-substituted ($C_1$–$C_{10}$) straight or branched chain alkyl, cycloalkyl, alkoxyalkyl, cycloalkoxyalkyl, —COOR', —(CH$_2$)$_t$OH, —COO(CH$_2$)$_t$OH or a moiety of the formula:

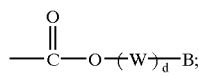

each of V and W is independently substituted or non-substituted ($C_1$–$C_{10}$) straight or branched chain alkylene, cycloalkylene, alkoxyalkylene or cycloalkoxyalkylene;

R' is hydrogen, substituted or non-substituted ($C_1$–$C_{10}$) straight or branched chain alkyl, cycloalkyl, alkoxyalkyl or cycloalkoxyalkyl;

R'' is an acid labile protecting group;

each of $R_1$–$R_{12}$ is independently hydrogen, substituted or non-substituted ($C_1$–$C_{10}$) straight or branched chain alkyl, cycloalkyl, alkoxyalkyl, cycloalkoxyalkyl, —$CH_2OH$ or —$CH_2CH_2OH$;

n is an integer from 1 to 3; and each of d, m and t is independently an integer from 0 to 5.

2. A bicyclic photoresist monomer according to claim 1, wherein the acid labile protecting group is selected from the group consisting of tert-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, tert-butoxyethyl, 1-isobutoxyethyl and 2-acetylmenth-1-en-1-yl.

3. A bicyclic photoresist monomer according to claim 1, which is selected from the group consisting of: 2-(1-tert-butoxycarbonylpiperidin-2-yl)ethyl 5-norbornene-2-carboxylate; 2-2-(1-tert-butoxycarbonylpiperidin-2-yl)ethyl 5-norbornene-2,3-dicarboxylate; 2-(1-tert-butoxycarbonylpiperidin-2-yl)ethyl, 3-tert-butyl 5-norbornene-2,3-dicarboxylate; and 2,3-di[(1-tert-butoxycarbonylpiperidin-2-yl)ethyl]5-norbornene-2,3-dicarboxylate.

4. A process for preparing said bicyclic photoresist monomer of claim 1, wherein R is hydrogen, substituted or non-substituted ($C_1$–$C_{10}$) straight or branched chain alkyl, cycloalkyl, alkoxyalkyl, or cycloalkoxyalkyl, said process comprising the steps of:

(a) reacting a diene compound of the formula:

with an acrylate compound of the formula:

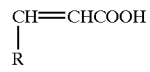

to produce a bicyclic carboxylic acid compound of the formula:

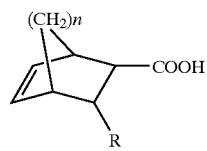

wherein R is hydrogen, substituted or non-substituted ($C_1$–$C_{10}$) straight or branched chain alkyl, cycloalkyl, alkoxyalkyl, or cycloalkoxyalkyl; and n is an integer from 1 to 3;

(b) reacting said bicyclic carboxylic acid compound with thionyl chloride;

(c) reacting compound produced in said step (b) with a hydroxy compound of the formula:

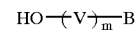

wherein, V is substituted or non-substituted ($C_1$–$C_{10}$) straight or branched chain alkylene, cycloalkylene, alkoxyalkylene or cycloalkoxyalkylene;

B is a moiety of the formula:

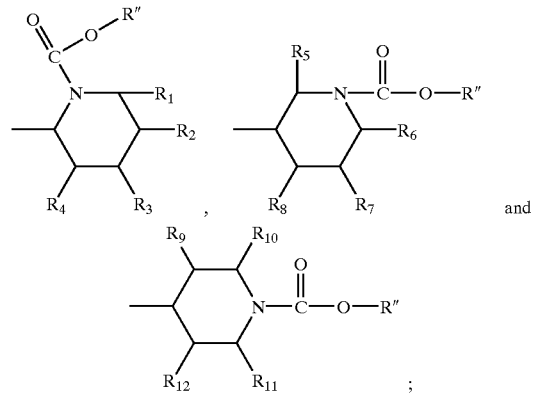

and wherein each of $R_1$–$R_{12}$ is independently hydrogen or substituted or non-substituted ($C_1$–$C_{10}$) straight or branched chain alkyl, cycloalkyl, alkoxyalkyl, cycloalkoxyalkyl, —$CH_2OH$ or —$CH_2CH_2OH$;

R'' is an acid labile protecting group; and m is an integer from 0 to 5.

5. The process according to claim 4, wherein said step (a) comprises:

(i) combining said diene compound and said acrylate compound in an organic solvent at a temperature range of from about −35° C. to about −25° C.; and (ii) increasing the reaction temperature to room temperature.

6. A process for preparing said bicyclic photoresist monomer of claim 1, wherein R is a moiety of the formula: —COOR' or

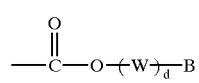

said process comprising the steps of:

(a) reacting a diene compound of the formula:

with maleic anhydride to produce 5-norbornene-2,3-dicarboxylic anhydride, wherein n is an integer from 1 to 3;

(b) (i) when R is COOR', contacting said 5-norbornene-2,3-dicarboxylic anhydride with R'OH in the presence of an acid catalyst to produce a 5-norbornene-2,3-dicarboxylate compound; or (ii) when R is:

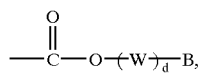

hydrating said 5-norbornene-2,3-dicarboxylic anhydride to produce a 5-norbornene-2,3-dicarboxylic acid;
wherein
W is substituted or non-substituted ($C_1$–$C_{10}$) straight or branched chain alkylene, cycloalkylene, alkoxyalkylene or cycloalkoxyalkylene;
B is selected from the group consisting of moieties of the formula:

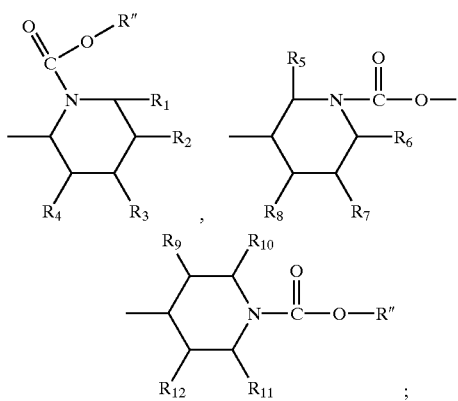

R' is hydrogen, substituted or non-substituted ($C_1$–$C_{10}$) straight or branched chain alkyl, cycloalkyl, alkoxyalkyl or cycloalkoxyalkyl;
R" is an acid labile protecting group;
each of $R_1$–$R_{12}$ is independently hydrogen, substituted or non-substituted ($C_1$–$C_{10}$) straight or branched chain alkyl, cycloalkyl, alkoxyalkyl, cycloalkoxyalkyl, —$CH_2OH$ or —$CH_2CH_2OH$; and
d is an integer from 0 to 5; and (c) reacting said 5-norbornene-2,3-dicarboxylate or 5-norbornene-2,3-dicarboxylic acid compound with a hydroxy compound of the formula:

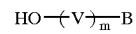

wherein, V is substituted or non-substituted ($C_1$–$C_{10}$) straight or branched chain alkylene, cycloalkylene, alkoxyalkylene or cycloalkoxyalkylene;
B is a moiety of the formula:

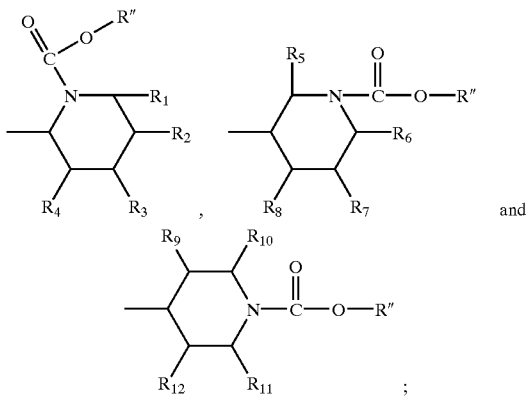

and wherein each of $R_1$–$R_{12}$ is independently hydrogen or substituted or non-substituted ($C_1$–$C_{10}$) straight or branched chain alkyl, cycloalkyl, alkoxyalkyl, cycloalkoxyalkyl, —$CH2OH$ or —$CH_2CH_2OH$;
R" is an acid labile protecting group; and
m is an integer from 0 to 5.

7. The process according to claim 6, wherein said step (a) comprises:

(i) combining said diene compound and said maleic anhydride in an organic solvent at a temperature range of from about −35° C. to about −25° C.; and (ii) increasing the reaction temperature to room temperature.

* * * * *

UNITED STATES PATENT AND TRADEMARK OFFICE
CERTIFICATE OF CORRECTION

PATENT NO. : 6,531,562 B2 Page 1 of 1
DATED : March 11, 2003
INVENTOR(S) : Min Ho Jung et al.

It is certified that error appears in the above-identified patent and that said Letters Patent is hereby corrected as shown below:

<u>Column 6,</u>
Lines 11-12, the phrase "5-norbomrene-2,3-dicarboxylic acid;" should read -- 5-norbornene-2,3-dicarboxylic acid; --.

<u>Column 10,</u>
Line 42, the word "dicarbomate" should read -- dicarbonate --.

Signed and Sealed this

Twentieth Day of January, 2004

JON W. DUDAS
*Acting Director of the United States Patent and Trademark Office*